United States Patent
Amit et al.

(10) Patent No.: US 10,331,050 B2
(45) Date of Patent: Jun. 25, 2019

(54) LITHOGRAPHY SYSTEMS WITH INTEGRATED METROLOGY TOOLS HAVING ENHANCED FUNCTIONALITIES

(71) Applicant: KLA-Tencor Corporation, Milpitas, CA (US)

(72) Inventors: Eran Amit, Haifa (IL); Roie Volkovich, Hadera (IL); Liran Yerushalmi, Zicron Yaacob (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/568,304

(22) PCT Filed: Aug. 21, 2017

(86) PCT No.: PCT/US2017/047742
§ 371 (c)(1),
(2) Date: Oct. 20, 2017

(87) PCT Pub. No.: WO2018/089076
PCT Pub. Date: May 17, 2018

(65) Prior Publication Data
US 2018/0299791 A1 Oct. 18, 2018

Related U.S. Application Data

(60) Provisional application No. 62/421,932, filed on Nov. 14, 2016.

(51) Int. Cl.
*G03B 27/32* (2006.01)
*G03F 7/20* (2006.01)

(52) U.S. Cl.
CPC ...... *G03F 7/70991* (2013.01); *G03F 7/70483* (2013.01); *G03F 7/70491* (2013.01);
(Continued)

(58) Field of Classification Search
CPC ......... H01L 21/67225; H01L 21/67242; H01L 21/67253; H01L 21/67259;
(Continued)

(56) References Cited

U.S. PATENT DOCUMENTS 6,978,189 B1 * 12/2005 Bode ................. H01L 21/67253
438/5
2002/0165636 A1 * 11/2002 Hasan .................... G05B 15/02
700/121
(Continued)

FOREIGN PATENT DOCUMENTS

WO 2014074868 A1 5/2014

OTHER PUBLICATIONS

ISA/KR, International Search Report for PCT/US2017/047742 dated Nov. 28, 2017.

*Primary Examiner* — Christina A Riddle
(74) *Attorney, Agent, or Firm* — Hodgson Russ LLP

(57) ABSTRACT

Lithography systems and methods are provided with enhanced performance based on broader utilization of the integrated metrology tool in the printing tool to handle the metrology measurements in the system in a more sophisticated and optimized way. Additional operation channels are disclosed, enabling the integrated metrology tool to monitor and/or allocate metrology measurements thereby and by a standalone metrology tool with respect to specified temporal limitations of the printing tool; to adjust and optimize the metrology measurement recipes; to provide better process control to optimize process parameters of the printing tool; as well as to group process parameters of the printing tool according to a metrology measurements landscape.

16 Claims, 3 Drawing Sheets

(52) U.S. Cl.
CPC ...... *G03F 7/70525* (2013.01); *G03F 7/70533* (2013.01); *G03F 7/70616* (2013.01); *G03F 7/70625* (2013.01); *G03F 7/70633* (2013.01)

(58) Field of Classification Search
CPC ... H01L 21/67276; H01L 22/10; H01L 22/12; H01L 22/20; H01L 22/22; H01L 22/26; G05B 19/418; G05B 2219/37224; G05B 2219/45028; G05B 2219/32182; G05B 2219/32179; G05B 2219/32187; G05B 2219/32192; G05B 2219/32197; G05B 2219/32216; G05B 2219/32248; G05B 2219/32366; G05B 2219/32368; G03F 9/70; G03F 9/7019; G03F 7/70625; G03F 7/70616; G03F 7/70633; G03F 7/70641; G03F 7/70658; G03F 7/70666; G03F 7/70675; G03F 7/70683; G03F 7/70991; G03F 7/7085; G03F 7/70608; G03F 7/70483; G03F 7/70491; G03F 7/70525; G03F 7/70533; G03F 7/70541; G03F 7/7065; G01N 21/956; G01N 21/95607; G01N 2021/8867; G01N 2021/8411; G01N 2021/8416

USPC ......... 355/52, 53, 55, 67–71, 77; 250/492.1, 250/492.2, 492.22, 493.1, 548; 356/388, 356/390, 73; 716/54, 51, 55; 438/14, 16; 700/103, 108–110, 117, 121; 702/150, 702/81–84, 94, 182, 35

See application file for complete search history.

(56) References Cited

U.S. PATENT DOCUMENTS

| | | | |
|---|---|---|---|
| 2003/0082837 A1* | 5/2003 | Pasadyn | H01L 22/20 |
| | | | 438/14 |
| 2008/0027577 A1 | 1/2008 | Horak et al. | |
| 2012/0303151 A1* | 11/2012 | Ye | G05B 13/04 |
| | | | 700/119 |
| 2013/0245806 A1* | 9/2013 | Vaid | H01L 22/20 |
| | | | 700/108 |
| 2014/0199791 A1 | 7/2014 | Park et al. | |
| 2014/0354969 A1 | 12/2014 | Elings et al. | |
| 2016/0131983 A1* | 5/2016 | Holovinger | H01L 22/12 |
| | | | 356/401 |
| 2016/0313658 A1 | 10/2016 | Marciano et al. | |
| 2018/0023950 A1 | 1/2018 | Marciano et al. | |

* cited by examiner

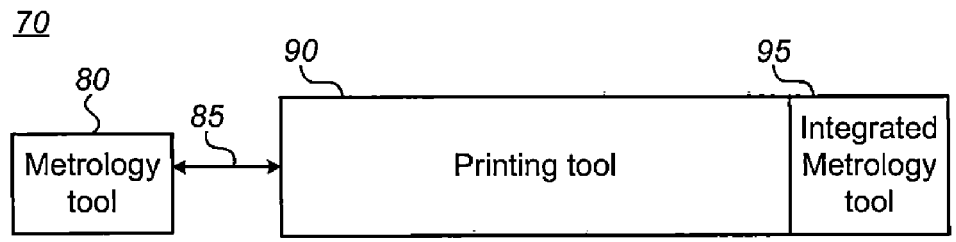
*Figure 1 – Prior art*
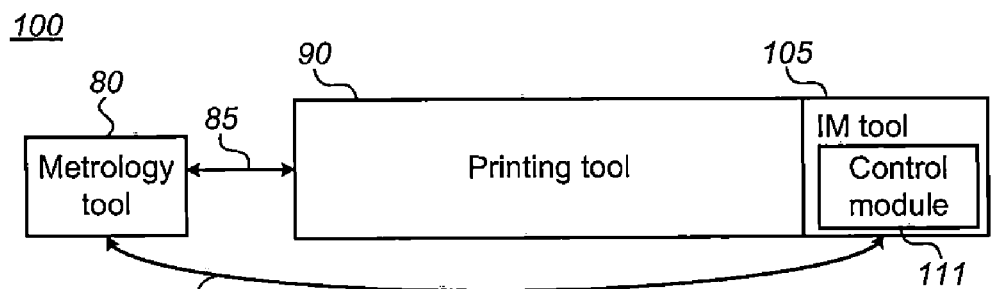
*Figure 2*
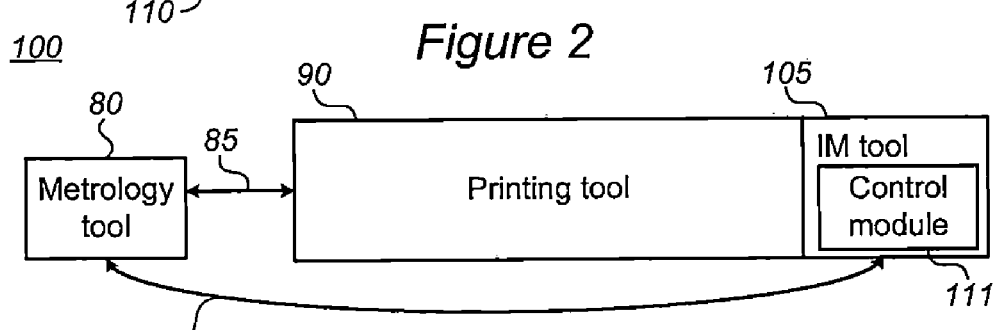
*Figure 3*
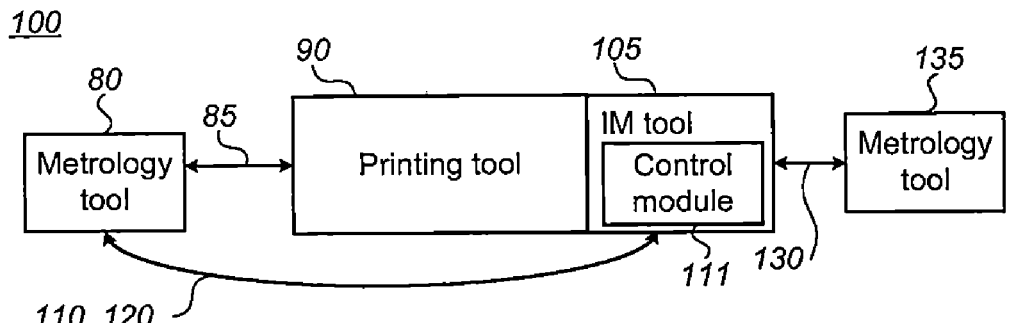
*Figure 4*

200

210 — Monitoring, by the integrated metrology tool of a lithography printing tool, metrology measurements by the integrated and standalone metrology tools with respect to specified temporal limitations of the printing tool 220 — Allocating, by the integrated metrology tool, metrology measurements thereby and by the standalone metrology tool with respect to specified temporal limitations of the printing tool 230 — Adjusting and/or optimizing a metrology measurement recipe according to the specified temporal limitations 240 — Optimizing process parameters of the printing tool by process control software, based on metrology measurements by at least the integrated metrology tool 250 — Grouping process parameters of the printing tool according to a metrology measurements landscape 260 — Deriving the metrology measurements landscape by at least the integrated metrology tool

*Figure 8*

LITHOGRAPHY SYSTEMS WITH INTEGRATED METROLOGY TOOLS HAVING ENHANCED FUNCTIONALITIES

CROSS REFERENCE TO RELATED APPLICATIONS

This application claims the benefit of U.S. Provisional Patent Application No. 62/421,932 filed on Nov. 14, 2016, which is incorporated herein by reference in its entirety.

BACKGROUND OF THE INVENTION

1. Technical Field

The present invention relates to the field of metrology, and more particularly, to optimized lithography systems.

2. Discussion of Related Art

Lithography system have to handle continuously growing complexity, smaller printing nodes and increases in metrology input, within shrinking printing time requirements.

SUMMARY OF THE INVENTION the following is a simplified summary providing an initial understanding of the invention. The summary does not necessarily identify key elements nor limits the scope of the invention, but merely serves as an introduction to the following description.

One aspect of the present invention provides a lithography system comprising: a printing tool with an integrated metrology tool, and a standalone metrology tool connected to the printing tool and configured to perform metrology measurements on wafers produced by the printing tool, wherein the lithography system further comprises a monitoring channel connecting the integrated metrology tool with the standalone metrology tool, and the integrated metrology tool is further configured to allocate metrology measurements between the integrated metrology tool and the standalone metrology tool and monitor the allocation and the metrology measurement with respect to specified temporal limitations of the printing tool.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1 is a high level schematic block diagram illustration of lithography systems according to the prior art.

FIG. 2 is a high level schematic block diagram illustrating lithography systems with improved process tracking and metrology measurement analysis, according to some embodiments of the invention.

FIGS. 3 and 4 are high level schematic block diagrams illustrating lithography systems with recipe optimization at the level of the integrated metrology tool, according to some embodiments of the invention.

FIG. 8 is a high level flowchart illustrating a method, according to some embodiments of the invention.

DETAILED DESCRIPTION OF THE INVENTION

Figure 5:
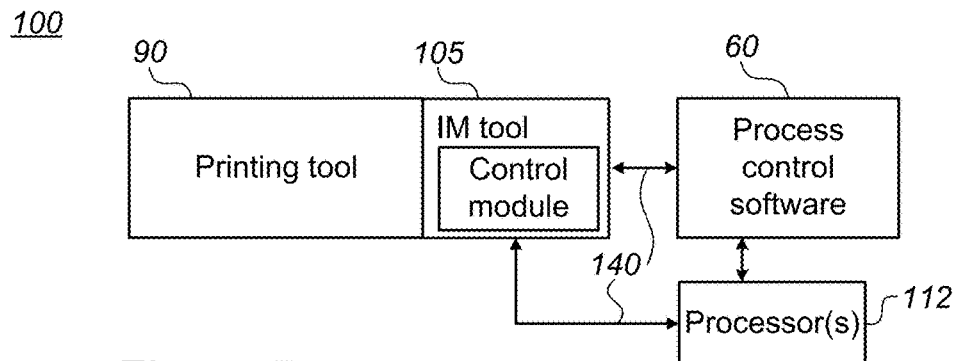
FIG. 5 is a high level schematic block diagram illustrating of lithography systems with improved process control, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Lithography systems and methods are provided with enhanced performance based on broader utilization of the integrated metrology tool in the printing tool to handle the metrology measurements in the system in a more sophisticated and optimized way. Additional operation channels are disclosed, enabling the integrated metrology tool to monitor and/or allocate metrology measurements thereby and by a standalone metrology tool with respect to specified temporal limitations of the printing tool; to adjust and optimize the metrology measurement recipes; to provide better process control to optimize process parameters of the printing tool; as well as to group process parameters of the printing tool according to a metrology measurements landscape.

FIG. 1 is a high level schematic block diagram illustration of lithography systems 70 according to the prior art. Current lithography systems 70 comprise a communication channel 115 between a printing tool 90 (e.g., a scanner, possibly a stepper, or any other printing tool) which connects a standalone metrology tool 80 to printing tool 90. Standalone metrology tool 80 is configured to perform metrology measurements on wafers produced by printing tool 90, e.g., to calculate corrections and provide feedback to printing tool 90, based on metrology measurements by standalone metrology tool 80. For example, in current practice, standalone metrology tool 80 is applied to measure several wafers per FOUP (front opening unified pod, e.g., 25 wafers) and calculate the scanner corrections required to meet the overlay budget. The corrections are then feedback to printing tool 90 to improve the overlay in its operation. Certain prior art configurations of printing tool 90 include an integrated metrology (IM) tool 95 configured to reduce the duration of the sampling for metrology measurements to meet scanner exposure time limitations. Integrated metrology tool 95 may be used in the prior art instead of or in addition to standalone metrology tool 80.

FIGS. 2-7 are high level schematic block diagram illustrations of lithography systems 100 according to some embodiments of the invention. FIGS. 2-7 illustrate schematically multiple approaches, which may be combined in various ways to improve throughput and yield with respect to prior art lithography systems 70. Elements from FIGS. 2-7 may be combined in any operable combination, and the illustration of certain elements in certain figures and not in others merely serves an explanatory purpose and is non-limiting. One or more processor(s) 112 may be used to implement any embodiment of control module 111 (see FIG. 7). It is also noted that while the disclosure relates to one standalone metrology tool and one integrated metrology tool in the printing tool, disclosed systems and methods may just as well be applied to more complex systems with multiple metrology tools and/or printing tools.

Lithography systems 100 demonstrate several alternative and/or complementary ways to enhance performance by higher level integration and use of integrated metrology tool 95 with respect to multiple, independent and/or complementary requirements from lithography systems 100. Disclosed lithography systems 100 may be configured to provide improved cycle time by reducing the reaction time to process excursions as well improve process accuracy by avoiding sampling reduction which is commonly required in prior art lithography systems 70 for meeting the scanner throughput, and may result in larger errors (e.g., larger residuals and required correction). As a result, disclosed lithography systems 100 may increase the process yield and reduce costs. In the following, potentially synergetic approaches and systems are disclosed for improving the monitoring of process excursions and process variations, improving the recipe optimization, improving the overlay accuracy and improving the Correction Per Exposure (CPE) rate.

FIG. 2 is a high level schematic block diagram illustrating lithography systems 100 with improved process tracking and metrology measurement analysis, according to some embodiments of the invention. Lithography systems 100 may be configured to have enhanced monitoring performance with respect to process excursions. In disclosed embodiments, a monitoring channel 110 may be established between a modified integrated metrology tool 105 and standalone metrology tool 80, and a control module 111 in integrated metrology tool 105 may be configured to allocate to integrated metrology tool 105 and/or to standalone metrology tool 80 and to monitor the metrology measurements and the decision and allocation process. For example, a possible excursion can be detected by any of tracking the overlay, accuracy flags and/or any other parameter, by control module 111, standalone metrology tool 80 and/or any other tool. In case an excursion is detected, control module 111 may be configured to hold printing tool 90 to enable exposure for the suspected layer and decide to measure the overlay using integrated metrology tool 105, via monitoring channel 110, using standalone metrology tool 80, for performing a more extensive analysis. Control module 111 and/or standalone metrology tool 80 may be further configured to detect, via monitoring channel 110, process changes and adjust the metrology measurement recipe, using integrated metrology tool 105 within the scanner exposure time limitations. Therefore, monitoring channel 110 provides flexibility in the application of metrology measurement which provides both quick identification of excursion as well as means to accommodate the quality of the metrology measurements to specified scanner exposure time limitations or other requirements.

FIGS. 3 and 4 are high level schematic block diagrams illustrating lithography systems 100 with recipe optimization at the level of integrated metrology tool 105, according to some embodiments of the invention. In certain embodiments, integrated metrology tool 105 and/or control module 111 may be configured to perform recipe optimization and be configured to determine what scope of recipe optimization is required and to transfer, via a monitoring and optimization channel 120, more extensive recipe optimizations to standalone metrology tool 80 and/or to transfer, via an optimization channel 130, more extensive recipe optimizations to an additional metrology tool 135 or other external tools (e.g., simulation tools). Control module 111 may be configured to use integrated metrology tool 105 at a first phase of recipe optimization, e.g., to derive an overlay landscape as function of the wavelength and suggest optimal measurement parameters (e.g., the optimal wavelength, appetizer or other setups)—as disclosed in any of U.S. Application Publication No. 2016/0313658 and U.S. application Ser. No. 15/329,618, incorporated herein by reference in their entirety. It is noted that the landscape relates to an at least partially continuous dependency of at least one metrology metric (e.g., overlay for the overlay landscape) on at least one recipe parameter, by simulation or in preparatory measurements. The derived dependency may be used to relate metrology measurements and process parameters in an analytical way or by simulation. The optimal measurement parameters may then by transferred to standalone metrology tool 80 via monitoring and optimization channel 120, and/or to additional metrology tool 135 via optimization channel 130—to optimize the performance of standalone metrology tool 80, reduce cycle time and improve accuracy.

FIG. 5 is a high level schematic block diagram illustrating of lithography systems 100 with improved process control, according to some embodiments of the invention. Systems 100 may comprise a process control channel 140 connecting integrated metrology tool 105 and/or control module 111 to provide input for process control software 60 (e.g., in a module which receives overlay data, optical critical dimensions (OCD) data, focus and dose data, etc. and uses the received data to improve the control over the process) and be used for improving process control outside the lithography cell. Possible processor(s) 112 associated with control module 111 may be configured to carry out at least part of process control software 60. Integrated metrology tool 105 may be configured to derive any process parameter, such as the overlay, accuracy values, and other process parameters which may be useful for process control, and provide the process parameter(s) via process control channel 140 to process control software 60 for improving process control.

Figure 6:
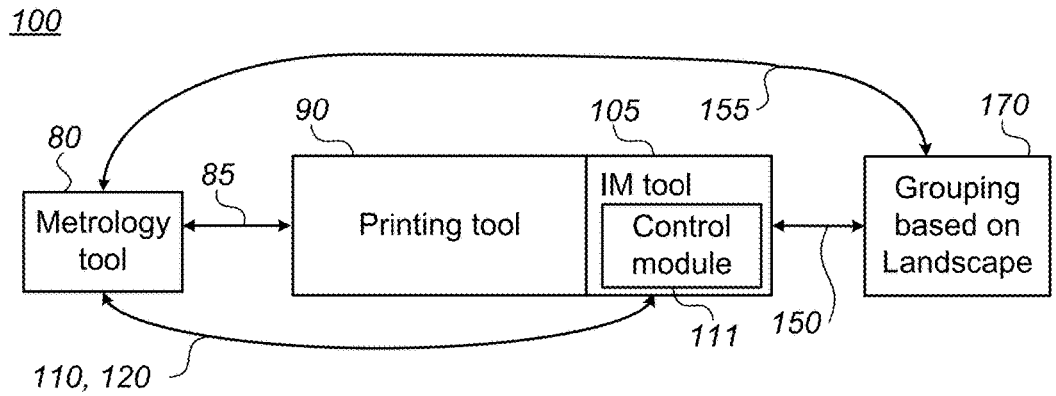
FIG. 6 is a high level schematic block diagram illustrating of lithography systems with landscape-based grouping, according to some embodiments of the invention.

FIG. 6 is a high level schematic block diagram illustrating of lithography systems 100 with landscape-based grouping, according to some embodiments of the invention. Systems 100 may comprise a grouping channel 150 connecting integrated metrology tool 105 and/or control module 111 to provide input for grouping of control, which is based on landscape information. The grouping may be carried out by a grouping module 170, implemented externally and/or in any of integrated metrology tool 105, control module 111 and standalone metrology tool 80. System 100 may be configured to group control of any of wafers, chucks, processes, scanner operations, lithography or post lithography processes etc., according to metrology and/or process parameters (e.g., overlay, accuracy values or any process parameter) received through grouping channel 150 from integrated metrology tool 105 and/or control module 111; and alternatively or complementarily, received through a grouping channel 155 from standalone metrology tool 80. The grouping may be carried out by any processing unit, possibly even by control module 111, and may be based on any landscape information or parameter, e.g., a wavelength signature, as disclosed in any of U.S. Application Publication No. 2016/0313658 and U.S. application Ser. No. 15/329,618, incorporated herein by reference in their entirety.

For example, integrated metrology tool 105 may be configured to provide a measure of the process shift with respect to a known calibrated state, such as the combination at t=0 of different process tools at their t=0 calibrated states, as a non-limiting example. Once process shifts are detected by integrated metrology tool 105, the conditions of the process tools (e.g., printing tool 90) may be modified gradually until they returns to their t=0 state. This may be achieved using feedback loop(s) between the metrology tool(s) 105, 80 and multiple process tools (e.g., printing tool 90).

In certain embodiments, the typical fingerprint of each process tool may be learned by metrology tools 105 and/or 80, which may be configured to provide specific feedback(s) for each process tool.

Figure 7:
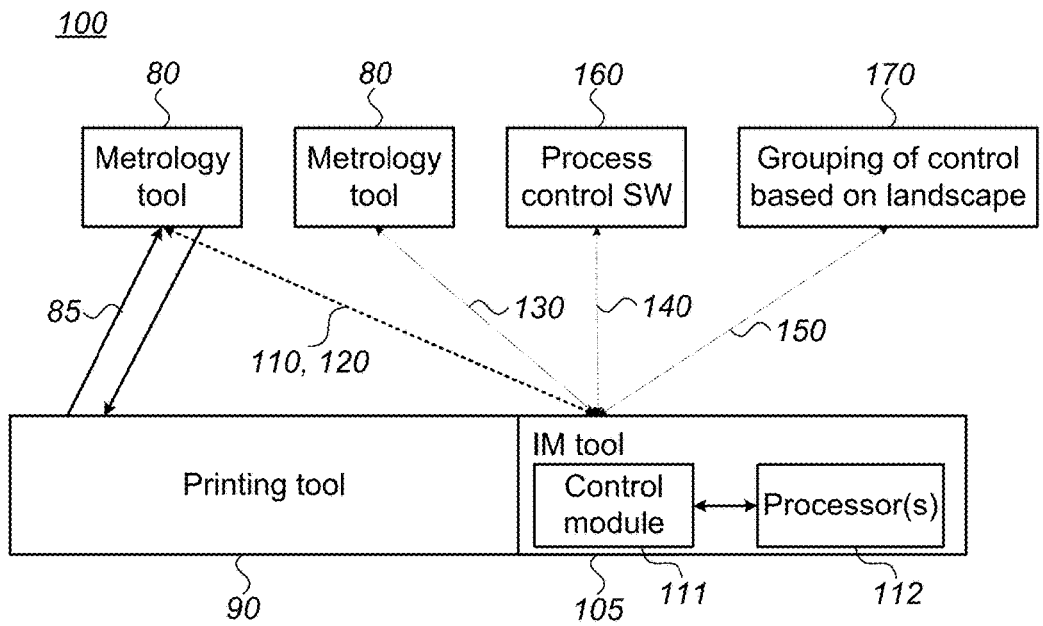
FIG. 7 is a high level schematic block diagram illustrating of lithography systems with various configurations of channels disclosed above, according to some embodiments of the invention.

FIG. 7 is a high level schematic block diagram illustrating of lithography systems 100 with various configurations of channels 110-150 disclosed above, according to some embodiments of the invention. Various disclosed embodiments comprise, in addition to prior art channel 85 between printing tool 90 and standalone metrology tool 80, any of monitoring channel 110, monitoring and optimization channel 120, optimization channel 130, process control channel 140 and/or grouping channel 150 and/or 155 disclosed above. Any combination thereof may be set as a configuration of disclosed lithography systems 100.

FIG. 8 is a high level flowchart illustrating a method 200, according to some embodiments of the invention. The method stages may be carried out with respect to lithography systems 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Method 200 may comprise the following stages, irrespective of their order.

Method 200 may comprise monitoring (stage 210) and/or allocating (stage 220), by the integrated metrology tool of a lithography printing tool, metrology measurements by the integrated metrology tool and a standalone metrology tool with respect to specified temporal limitations of the printing tool.

Method 200 may comprise adjusting and/or optimizing a metrology measurement recipe according to the specified temporal limitations (stage 230).

Method 200 may further comprise optimizing process parameters of the printing tool by process control software, based on metrology measurements by at least the integrated metrology tool (stage 240).

Method 200 may further comprise grouping process parameters of the printing tool according to a metrology measurements landscape (stage 250).

Method 200 may further comprise deriving the metrology measurements landscape by at least the integrated metrology tool (stage 260).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A lithography system comprising:
   a printing tool with an integrated metrology tool, and
   a standalone metrology tool connected to the printing tool and configured to perform metrology measurements on wafers produced by the printing tool,
   wherein the lithography system further comprises a monitoring channel connecting the integrated metrology tool with the standalone metrology tool, and the integrated metrology tool is further configured to allocate metrology measurements between the integrated metrology tool and the standalone metrology tool and monitor the allocation and the metrology measurement with respect to specified temporal limitations of the printing tool.

2. The lithography system of claim 1, wherein the monitoring comprises adjusting a metrology measurement recipe according to the specified temporal limitations.

3. The lithography system of claim 1, further comprising an optimization channel connecting the integrated metrology tool with a metrology tool configured to optimize a metrology measurement recipe for the lithography system.

4. The lithography system of claim 3, wherein the metrology tool is the standalone metrology tool.

5. The lithography system of claim 1, further comprising a process control channel connecting the integrated metrology tool with process control software configured to optimize process parameters of the printing tool.

6. The lithography system of claim 1, further comprising a grouping channel connecting the integrated metrology tool with a grouping module configured to group process parameters of the printing tool according to a metrology measurements landscape.

7. The lithography system of claim 6, wherein the metrology measurements landscape is an at least partially continuous dependency of at least one metrology metric on at least one recipe parameter, derived by the respective metrology tool.

8. The lithography system of claim 1, further comprising a grouping channel connecting the standalone metrology tool with a grouping module configured to group process parameters of the printing tool according to a metrology measurements landscape.

9. The lithography system of claim 8, wherein the metrology measurements landscape is an at least partially continuous dependency of at least one metrology metric on at least one recipe parameter, derived by the respective metrology tool.

10. A method comprising allocating and monitoring, by an integrated metrology tool of a lithography printing tool, metrology measurements by the integrated metrology tool and a standalone metrology tool with respect to specified temporal limitations of the printing tool, wherein the monitoring comprises adjusting a metrology measurement recipe according to the specified temporal limitations.

11. The method of claim 10, further comprising optimizing process parameters of the printing tool by process control software, based on metrology measurements by at least the integrated metrology tool.

12. The method of claim 10, further comprising grouping process parameters of the printing tool according to a metrology measurements landscape.

13. The method of claim 12, further comprising deriving the metrology measurements landscape by at least the integrated metrology tool.

14. The method of claim 10, carried out at least partly by a computer processor.

15. A computer program product comprising a non-transitory computer readable storage medium having a computer readable program embodied therewith, the computer readable program configured to carry out the method of claim 10.

16. The method of claim 10, wherein the adjusting comprises optimizing the metrology measurement recipe according to the specified temporal limitations.

* * * * *